(12) United States Patent  
Cooper

(10) Patent No.: US 6,466,144 B1
(45) Date of Patent: Oct. 15, 2002

(54) DATA DECOMPRESSOR FOR USE WITH A DATA COMPRESSOR IMPLEMENTED WITH LIMITED LENGTH CHARACTER TABLES AND COMPACT STRING CODES

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/002,839

(22) Filed: Nov. 30, 2001

(51) Int. Cl.[7] .................................................. H03M 7/00

(52) U.S. Cl. ....................................................... 341/106

(58) Field of Search ........................... 341/106, 50, 61, 341/51, 87, 65, 63; 340/347

(56) References Cited

U.S. PATENT DOCUMENTS

| | | | | |
|---|---|---|---|---|
| 4,558,302 A | * | 12/1985 | Welch | 340/347 |
| 5,838,264 A | * | 11/1998 | Cooper | 341/106 |
| 5,861,827 A | * | 1/1999 | Welch et al. | 341/51 |
| 6,169,499 B1 | * | 1/2001 | Cooper | 341/51 |
| 6,307,488 B1 | * | 10/2001 | Cooper | 341/51 |

* cited by examiner

Primary Examiner—Brian Young
Assistant Examiner—John B Nguyen
(74) Attorney, Agent, or Firm—Albert B. Cooper; Mark T. Starr; Michael B. Atlass

(57) ABSTRACT

A decompressor recovers and outputs a stream of data characters corresponding to an input stream of compressed codes. The decompressor includes a dictionary that stores strings of data characters having respective codes associated therewith. A currently received compressed code accesses the dictionary to recover a string and the decompressor outputs the characters of the recovered string so as to provide the output stream of data characters. An extended string is inserted into the dictionary that comprises the string corresponding to the previously received code extended by the first character of the recovered string. A code is assigned to the stored extended string. The decompressor maintains counts of inserted extended strings that have the same extension character for respective characters of the alphabet. The inserting of an extended string into the dictionary and the assigning of a code thereto are bypassed for an extended string having a particular extension character when the count of such strings attains an associated predetermined limit. Additionally, extended string insertion and code assignment are bypassed for an extended string having an extension character that is denoted as an excluded character.

24 Claims, 6 Drawing Sheets

*Character Processing*

*String Processing*

*Exception Case Processing*

INPUT COMPRESSED CODE STREAM $a_1\ b_1\ 5_1\ x_1\ 6_1\ 6_2\ x_2\ 5_2\ 6_3\ 5_3\ z_1\ 12_1\ 12_2\ a_2\ 15_1\ 5_4$

| ACT ION | PREV CODE | CURR CODE | CODE CNTR | DIRECTORY | | STRING COUNTER | CHAR | OUTPUT | BLOCKS OF FIG. 2-5 |
| | | | | PREFIX CODE | CHAR | | | | |
|---|---|---|---|---|---|---|---|---|---|
| 1 | $a_1$ | $a_1$ | 5 | | | | | $a_1$ | 60-68 |
| 2 | $b_1$ | $b_1$ | | $a_1$ | $b_1$ | 1 | b | $b_1$ | 80,81,83,90-96 |
| 3 | $5_1$ | $5_1$ | 6 | $b_1$ | $a_1$ | 1 | a | $a_1b_1$ | 97-99,86,80-82,84,189-196 |
| 4 | $x_1$ | $x_1$ | 7 | $5_1$ | $x_1$ | 1 | x | $x_1$ | 197-199,86,80,81,83,90-96 |
| 5 | $6_1$ | $6_1$ | 8 | $x_1$ | $b_1$ | 2 | b | $b_1a_1$ | 97-99,86,80-82,84,189-196 |
| 6 | $6_2$ | $6_2$ | 9 | $6_1$ | $b_1$ | 3 | b | $b_1a_1$ | 197-199,86,80-82,84,189-196 |
| 7 | $x_2$ | $x_2$ | 10 | $6_2$ | $a_1$ | 2 | a | $x_2$ | 197-199,86,80,81,83,90-94,100 |
| 8 | $5_2$ | $5_2$ | | $x_2$ | $b_1$ | 4 | b | $a_1b_1$ | 86,80-82,84,189-196 |
| 9 | $6_3$ | $6_3$ | 11 | $5_2$ | $a_1$ | 3 | a | $b_1a_1$ | 197-199,86,80-82,84,189-196 |
| 10 | $5_3$ | $5_3$ | 12 | $6_3$ | $a_1$ | | a | $a_1b_1$ | 197-199,86,80-82,84,189-196 |
| 11 | $z_1$ | $z_1$ | 13 | $5_3$ | | 5 | | $z_1$ | 197-199,86,80,81,83,90-93,100 |
| 12 | $12_1$ | $12_1$ | | $z_1$ | $b_1$ | | b | $b_1a_1a_1$ | 86,80-82,84,189-196 |
| 13 | $12_2$ | $12_2$ | 14 | $12_2$ | | | | $b_1a_1a_1$ | 197-199,86,80-82,84,189-194,200 |
| 14 | $a_2$ | $a_2$ | | $12_2$ | $a_2$ | 4 | a | $a_2$ | 86,80,81,83,90-96 |
| 15 | $15_1$ | $15_1$ | 15 | $a_2$ | $a_2$ | 5 | a | $a_2a_2$ | 97-99,86,80-82,85,300-305 |
| 16 | $5_4$ | $5_4$ | OVFL | | | | | $a_1b_1$ | 306-308,86,80-82,84,189-191,200 |
| 17 | | — | | | | | | | 86,80,END |

*Figure 6*

DATA DECOMPRESSOR FOR USE WITH A DATA COMPRESSOR IMPLEMENTED WITH LIMITED LENGTH CHARACTER TABLES AND COMPACT STRING CODES

CROSS REFERENCE TO RELATED APPLICATIONS

U.S. patent application Ser. No. 09/855,127 "Character Table Implemented Data Compression Method And Apparatus" by Cooper, filed May 14, 2001, discloses a character table implementation for LZ dictionary type compressors.

U.S. patent application Ser. No. 09/885,400 "Data Compression Method And Apparatus Implemented With Limited Length Character Tables" by Cooper, filed Jun. 20, 2001, discloses a data compression system similar to that of said Ser. No. 09/855,127 with the additional capability of selectively limiting the lengths of the character tables to provide selective string storage.

U.S. patent application Ser. No. 09/977,635 "Data Compression Method And Apparatus Implemented With Limited Length Character Tables And Compact String Code Utilization" by Cooper, filed Oct. 15, 2001, discloses a data compression system similar to that of said Ser. No. 09/885,400 with the additional capability of utilizing all of the assignable string codes to represent stored strings so as to favorably affect compression efficiency.

U.S. patent application Ser. No. 09/688,604 "Data Compression And Decompression Method And Apparatus With Embedded Filtering Of Infrequently Encountered Strings" by Cooper, filed Oct. 16, 2000, discloses an LZ dictionary type data compression and decompression system that excludes infrequently encountered strings from storage in the dictionary.

U.S. patent application Ser. No. 09/801,358 "Data Compression And Decompression Method And Apparatus With Embedded Filtering Of Dynamically Variable Infrequently Encountered Strings" by Cooper, filed Mar. 7, 2001, discloses a data compression and decompression system similar to that of said Ser. No. 09/688,604 with the additional capability of dynamically determining the strings to be excluded from storage.

BACKGROUND OF THE INVENTION

1. Field of the Invention

The invention relates to LZ data compression and decompression systems particularly with respect to the LZW compression and decompression methodologies. More particularly, the invention relates to a decompressor suitable for recovering the data character stream corresponding to the compressed code output stream of a data compressor of the type disclosed in said Ser. No. 09/977,635.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final —Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression and decompression systems, data character strings are stored and accessed in the compressor and decompressor dictionaries utilizing well known searchtree architectures and protocols. The compressor of said Ser. No. 09/977,635 utilizes a new string storage and access architecture and protocols involving limited length character tables which, it is believed, improves the performance of LZ type data compression algorithms. In the compressor of said Ser. No. 09/977,635, extended strings are excluded from storage when a character table location is unavailable in which to store the string because of character table exclusion or character table length limitation. When the extended string is excluded from storage, the string code that otherwise would have been assigned thereto is instead assigned to a subsequently stored string thereby utilizing a compact assignment of string codes.

It is an objective of the present invention to provide an efficient decompressor suitable to recover the data character stream corresponding to the compressed code output from a compressor of the type described in said Ser. No. 09/977,635.

It is a further objective of the present invention to provide a decompressor that selectively decompresses the compressed code stream from a compressor of the type described in said Ser. No. 09/977,635 or a standard LZW compressed code stream.

SUMMARY OF THE INVENTION

The objectives of the present invention are achieved by a decompressor that recovers and outputs a stream of data characters corresponding to an input stream of compressed codes. The decompressor includes storage means that stores strings of data characters, the stored strings having respective codes associated therewith. A currently received compressed code accesses the storage means to recover a string corresponding to the currently received compressed code. The decompressor outputs the characters of the recovered string so as to provide the output stream of data characters. An extended string is inserted into the storage means that comprises the string corresponding to the compressed code received previously to the currently received compressed code extended by the first character of the recovered string. The decompressor assigns a code to the stored extended string and maintains a count of extended strings which have a predetermined characteristic that are inserted into the storage means. The inserting of an extended string into the storage means and the assigning of a code to the extended string are controllably bypassed for extended strings having the predetermined characteristic when the count of such strings attains a predetermined limit.

In particular, the inserting of extended strings into the storage means and assigning of codes thereto are controllably bypassed when the count of inserted extended strings having the same extension character attains the predetermined limit. Such counts are maintained for the various characters of the alphabet and respective limits are predetermined for performing the controllable bypassing function.

An optional feature of the below described decompressor involves defaulting to a standard LZW data decompression configuration when the input stream of compressed codes is not received from a data compressor of the type described in said Ser. No. 09/977,635. The default configuration bypasses maintaining the counts of inserted extended strings that have the predetermined characteristics and bypasses the controllable bypassing of the extended string inserting and code assigning functions.

BRIEF DESCRIPTION OF THE DRAWINGS

FIG. 6 is a chart exemplifying the operations of the decompressor of FIG. 1 in accordance with the control flow charts of FIGS. 2–5.

DESCRIPTION OF THE PREFERRED EMBODIMENT

The best mode embodiment described below is predicated, generally, on the LZW methodology and utilizes the implementation described above where the single character strings are considered as recognized by the decompressor although not explicitly initialized therein.

The herein described decompressor is specifically directed to recovering the data character stream corresponding to the compressed code stream output of the compressor of said Ser. No. 09/977,635. Although the compressor of said Ser. No. 09/977,635 utilizes a novel limited length character table implementation architecture, the decompressor embodiment described below does not utilize the character table architecture. Instead, the decompressor herein is predicated on the standard LZW decompression methodology modified to include the protocols to provide compatibility with a compressor of the type described in said Ser. No. 09/977,635. A further feature of the invention is, therefore, efficient selectability of either decompression compatible with a compressor of the type described in said Ser. No. 09/977,635 or with a conventionally configured LZW compressor.

With respect to the compatibility of the below described decompressor with a compressor of the type described in said Ser. No. 09/977,635, the decompressor receives configuration parameters from the compressor through the network over which the compressor and decompressor are communicating. The configuration parameters may, for example, be included in the header of the compressed data file transmitted to the decompressor. In a manner to be described in greater detail, the configuration parameters include limits associated with the respective characters of the alphabet over which compression and decompression is being performed, excluded characters and the compressed code type.

Figure 1:
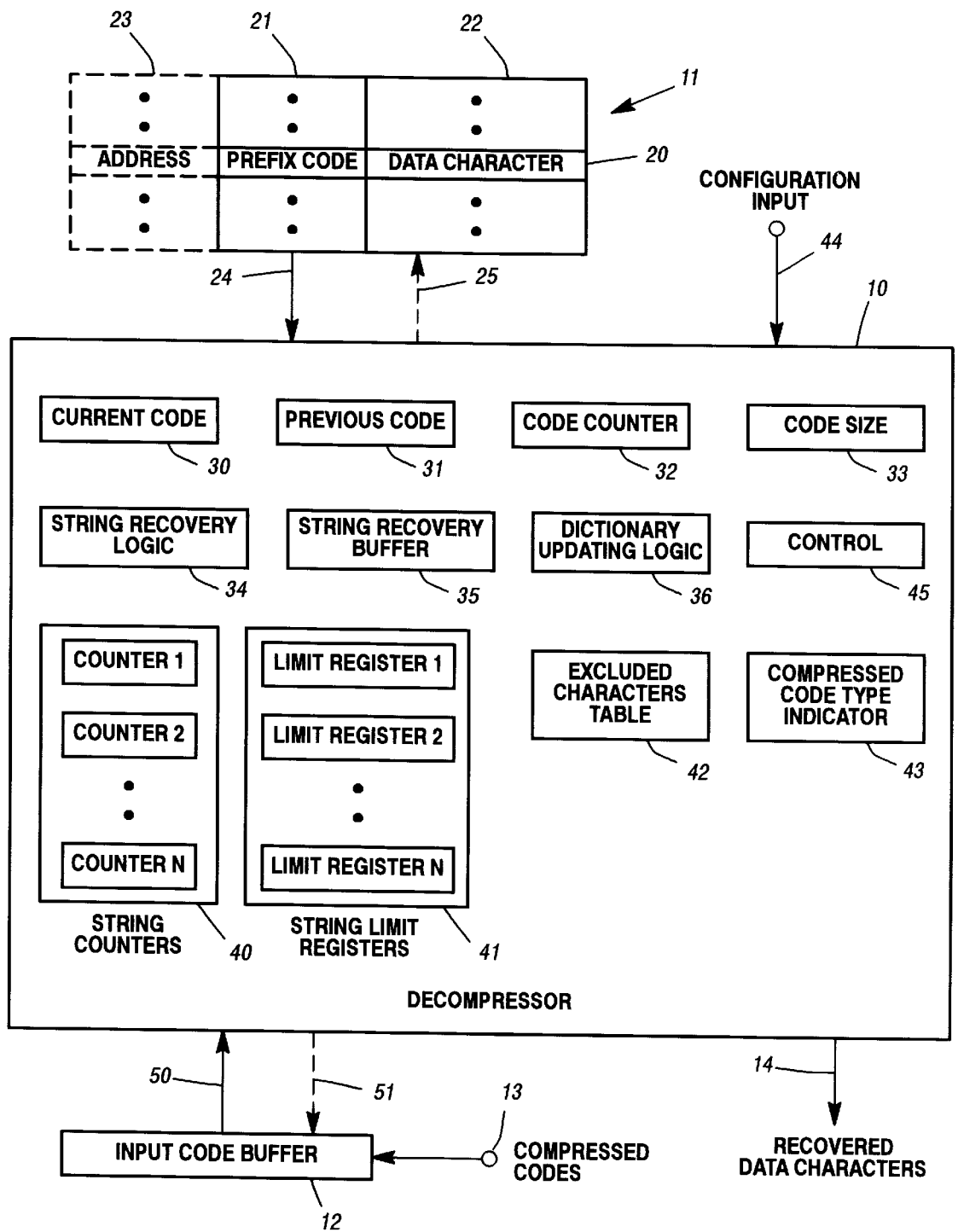
FIG. 1 is a schematic block diagram of a data decompressor for decompressing a stream of compressed codes in accordance with the present invention.

Referring to FIG. 1, a data decompressor 10, together with a Dictionary 11 and an Input Code Buffer 12, decompresses a stream of compressed codes applied at an input 13 into a recovered stream of data characters at an output 14.

The Dictionary 11, in cooperation with the decompressor 10, stores data character strings corresponding to received compressed code inputs. The Dictionary 11 is configured and utilized for string storage, searching and recovery in any well known manner described in the prior art (e.g., see said U.S. Pat. No. 4,558,302 or U.S. Pat. No. 5,838,264). Specifically, the Dictionary 11 contains a plurality of locations 20 including a Prefix Code field 21 and a Data Character field 22 accessed by an Address 23. A multiple character string is comprised of a prefix string of one or more characters followed by an extension character. In a well known manner, a string is stored in the Dictionary 11 by storing the code of the string prefix in the Prefix Code field 21 and the string extension character in the Data Character field 22 of a location 20 of the Dictionary. For convenience, the Address 23 is utilized as the code of the stored string. Data is communicated between the decompressor 10 and the Dictionary 11 via a bi-directional data bus 24 under control of a control bus 25.

The decompressor 10 includes a Current Code register 30, a Previous Code register 31, a Code Counter 32 and a Code Size register 33. The Code Counter 32 sequentially generates code values to be assigned to extended strings stored in the Dictionary 11 by the decompressor 10 and are used to process incoming compressed codes in a manner to be described. The Code Size register 33 is utilized, as is well known, to control the number of bits in which the decompressor 10 receives input compressed codes.

The decompressor 10 further includes string recovery logic 34 and a String Recovery Buffer 35 for recovering strings stored in the Dictionary 11 that are accessed by compressed codes. The general methodology for recovering data character strings from a dictionary in response to the string code corresponding thereto is well known in the art of data compression and decompression (e.g., see said U.S. Pat. No. 4,558,302 or U.S. Pat. No. 5,838,264). Briefly, the Dictionary 11 is accessed by a fetched Current Code and the data character in the field 22 of the accessed Dictionary location is transferred to the String Recovery Buffer 35. The code in the field 21 is utilized to again access the Dictionary 11 and the data character at the accessed location is again stored in the Buffer 35. The process continues until the code in the Prefix Code field 21 is a character value. This character is transferred to the Buffer 35 to complete the string recovery process. The data characters of the string in the Buffer 35 may then be provided to the decompressor output 14 in the appropriate order. It is appreciated that the data characters of the string are recovered from the field 22 of the Dictionary 11 in reverse order. The String Recovery Buffer 35 is utilized to provide the characters in the correct order.

The decompressor 10 further includes Dictionary updating logic 36 for entering update extended strings into the Dictionary 11 and assigning string codes thereto. The general methodology for updating a decompressor dictionary is well known in the art of data compression and decompression (e.g., see said U.S. Pat. No. 4,558,302 or U.S. Pat. No. 5,838,264). Briefly, the Dictionary 11 is updated by storing the extended string comprising the previous code extended by the first data character of the string corresponding to the currently fetched code. Accordingly, the previous code in the Previous Code register 31 and the first data character of the string corresponding to the fetched code in the Current Code register 30 are stored in the Prefix Code field 21 and the Data Character field 22, respectively, of the Dictionary location accessed by the Code Counter 32. The code in the Code Counter 32 is thereby assigned to the stored string.

The decompressor 10 includes String Counters 40 corresponding to the respective characters of the alphabet over which decompression is being performed. Each of the String Counters 40 maintains a count of the number of strings entered into the Dictionary 11 having as an extension character, the character associated with the Counter. The decompressor 10 maintains these counts in the String Counters 40 in the process of effecting synchronization with a compressor of the type described in said Ser. No. 09/977,635.

The decompressor 10 further includes String Limit registers 41, an Excluded Characters Table 42 and a Compressed Code Type Indicator 43. The string limits stored in the registers 41, the excluded characters stored in the Table 42 and the compressed code type stored in the Indicator 43 are configuration parameters received at a configuration input 44 from a compressor of the type described in said Ser. No. 09/977,635. The String Limit registers 41 correspond to the respective characters of the alphabet over which decompression is being performed. When a String Counter 40 associated with a character of the alphabet attains a count equal to the string limit in the associated register 41, the storage of and string code assignment to extended strings having the associated extension character are bypassed. In a similar manner, the storage of and string code assignment to an extended string having an extension character that is in the Excluded Characters Table 42 are bypassed. These protocols are effected so that the decompressor 10 maintains synchronism with a compressor of the type described in said Ser. No. 09/977,635. The protocols are utilized when the Compressed Code Type Indicator 43 indicates that the compressed code stream at the input 13 of the decompressor 10 is received from a compressor of the type described in said Ser. No. 09/977,635.

Although extended strings may be excluded for certain extension characters, the Counters 40 and registers 41 are illustrated for all N characters of the alphabet for convenience. The decompressor 10 includes control 45 for controlling the operations of the decompressor 10 in accordance with the operational flow charts of FIGS. 2–5 to be described below.

Included with the decompressor 10 is the Input Code Buffer 12 that buffers the input compressed codes received at the input 13. The individual input codes are applied from the Input Code Buffer 12, via a bus 50, to the Current Code register 30 in accordance with operations to be described. The decompressor 10 controls acquiring input codes from the Input Code Buffer 12 via a control bus 51.

Briefly, the operation of the decompressor 10 is as follows. The decompressor 10 is initialized by setting the Code Counter 32 to the first available multiple string code and by setting the Code Size register 33 to the initial code size. Additionally, the Dictionary 11, String Counters 40 and Current Code register 30 are cleared. Furthermore, the decompressor 10 is configured by setting the String Limit registers 41 to the appropriate string limits, by setting the Excluded Characters Table 42 to the appropriate excluded characters and by setting the Compressed Code Type Indicator 43 to the appropriate compressed code type, all as received at the configuration input 44.

Compressed codes are fetched to the Current Code register 30 utilizing the number of bits determined by the code size in the Code Size register 33. A fetched code is examined to determine if it is equal to a character value, corresponds to a multiple character string stored in the Dictionary 11 or corresponds to a multiple character string that is not yet stored in the decompressor Dictionary 11 although it is already stored in the compressor.

If the fetched code is equal to a character value, the character is output and tests are performed to determine if dictionary updating should be executed or bypassed. Basically, the tests involve determining if the character corresponding to Current Code is in the Excluded Characters Table 42 or if the String Counter 40 associated with the character is less than the string limit in the associated String Limit register 41. If the character is not excluded and the corresponding String Counter has not attained the associated string limit, the Dictionary 11 is updated by storing the update extended string at the location of the Dictionary 11 accessed by the Code Counter 32. The appropriate update extended string is the string corresponding to the Previous Code extended by the character corresponding to Current Code. The Code Counter 32 is advanced and the Code Size register 33 is advanced if required. Additionally, the String Counter 40 associated with the character corresponding to Current Code is incremented.

If, however, the character corresponding to Current Code is in the Excluded Characters Table 42 or the String Counter 40 associated with the character has attained the string limit in the corresponding String Limit register 41, the storage of the update extended string, the incrementation of the Code Counter 32 and the incrementation of the associated String Counter 40 is bypassed thus preserving the extant code in the Code Counter 32 for a subsequently stored extended string.

If, however, the compressed code type is not that of said Ser. No. 09/977,635, the tests are bypassed thus rendering the decompressor 10 compatible with standard LZW decompression.

The decompression cycle is concluded by transferring the code in the Current Code register 30 to the Previous Code register 31.

When the currently fetched code corresponds to a multiple character string stored in the Dictionary 11, processing is performed that is similar to that described with respect to a currently fetched single character code. When a multiple character string code is fetched, the string is recovered from the Dictionary 11 and the characters thereof are output in appropriate order. The tests described above with respect to a single character code are performed with respect to the first character of the string corresponding to the currently fetched code. Additionally, the update extended string in this case is the string corresponding to the previously fetched code extended by the first character of the string corresponding to the currently fetched code.

If the multiple character string corresponding to the fetched input code is not yet stored in the Dictionary 11, exception case processing similar to that described in said U.S. Pat. No. 4,558,302 is utilized. Briefly, the string corresponding to the previously fetched code is extended by the first character thereof to provide the string corresponding to the currently fetched code. The characters of this extended string are output in the appropriate order and the string is stored in the Dictionary 11 at the location accessed by the Code Counter 32. It is noted in the exception case processing that the tests described above with respect to the single character string and the first character of the multiple character string corresponding to the currently fetched code are not performed. Under the condition where the exception case of said U.S. Pat. No. 4,558,302 would occur, the described tests would not result in bypassing of the storage of the update extended string and the assignment of a string code thereto.

Figure 2:
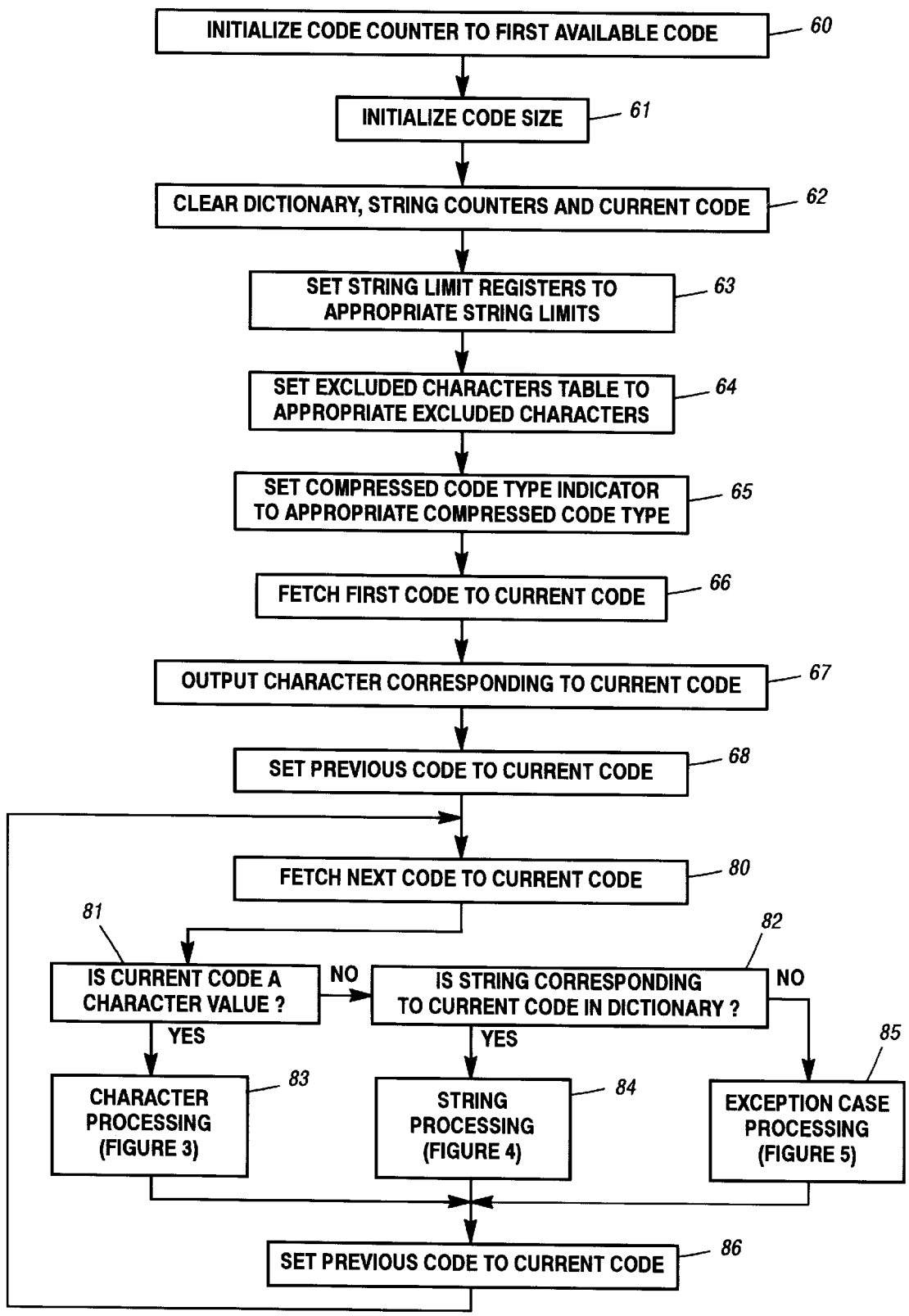
FIG. 2 is a control flow chart illustrating the operations executed by the decompressor of FIG. 1 so as to perform data decompression in accordance with the present invention.

Referring to FIG. 2, with continued reference to FIG. 1, a control flow chart is illustrated showing the detailed operations to be executed by the decompressor 10. The control 45 of the decompressor 10 is considered as containing appropriate circuitry, such as state machines, or appropriate software, to control execution of the operations. The control flow chart of FIG. 2 is predicated on a variable length code and the Code Size register 33 is utilized to this effect. In an ASCII variable length code implementation, the code size may begin with 9 bits and sequentially increase to 10, 11 and 12 bits at codes 512, 1024 and 2048, respectively. It is appreciated that a fixed code size may also be utilized with appropriate modifications to the embodiment.

Control enters a block 60 whereat the Code Counter 32 is initialized to a first available code, for example, 258 in the ASCII environment. At a block 61, the Code Size register 33 is initialized to the beginning code size, for example, 9 bits in ASCII embodiments. At a block 62, the Dictionary 11, the String Counters 40 and the Current Code register 30 are cleared.

At blocks 63, 64 and 65, respectively, the String Limit registers 41 are set to appropriate string limits, the Excluded Characters Table 42 is set to appropriate excluded characters and the Compressed Code Type Indicator 43 is set to the appropriate compressed code type. These configuration parameters are received at the input 44 of the decompressor 10 from, for example, a compressor of the type described in said Ser. No. 09/977,635. The string limits set into the String Limit registers 41 are the same as those set into the Length Limit registers 37 of the compressor of said Ser. No. 09/977,635. Similarly, the excluded characters set into the Excluded Characters Table 42 are the characters for which the links 35 of the compressor of said Ser. No. 09/977,635 are set to exclusion. These parameters are provided to the compressor of said Ser. No. 09/977,635 by the configuration engine of FIG. 4 thereof. A field (not shown) is utilized to transmit the compressed code type to the Compressed Code Type Indicator 43 of the decompressor 10.

Processing proceeds to a block 66 whereat the first input compressed code is fetched to the Current Code register 30 utilizing the number of bits determined by code size. Because of the operations of compressors, such as compressors of the type of said Ser. No. 09/977,635, the first fetched code represents a single character string. Accordingly, at a block 67, the character corresponding to Current Code is provided at the decompressor output 14. At a block 68, the code in the Current Code register 30 is transferred to the Previous Code register 31.

At a block 80, the next input compressed code is fetched to the Current Code register 30. It is appreciated that the code fetched to the Current Code register 30 may represent either a single character string or a multiple character string. As is well known, such strings are distinguished from one another by the value of the code. Generally, multiple character strings are represented by codes that are greater than or equal to the first available code discussed above with respect to the block 60. Codes for single character strings generally have values equal to, or representative of, the single character and therefore have values less than the first available code. In an ASCII environment a code representing a single character has a value less than 256 while a code representing a multiple character string has a value that is not less than 256.

Accordingly, at a block 81, the code in the Current Code register 30 is tested to determine if Current Code represents a character value. Conveniently, the test of the block 81 may be to determine if Current Code is less than a predetermined value greater than the character values. If so, the YES branch is taken from the block 81 to a block 83 whereat character processing is performed. Details of the character processing block 83 will be discussed with respect to FIG. 3.

If, at the block 81, Current Code does not represent a character value, the NO branch from the block 81 is taken to a block 82. At the block 82 a test is performed to determine if the string corresponding to Current Code is in the Dictionary 11. The test may be effected by accessing the Dictionary 11 at the address corresponding to Current Code and determining if the accessed location is empty. Alternatively, Current Code in the Current Code register 30 may be compared to the code in the Code Counter 32. The string corresponding to Current Code will be in the Dictionary 11 if Current Code is less than Code Counter.

If the string corresponding to Current Code is in the Dictionary 11, the YES branch from the block 82 is taken to a block 84 whereat string processing is performed. Details of the string processing of the block 84 will be discussed with respect to FIG. 4.

If, at the block 82, Current Code is not less than the code in the Code Counter 32, signifying that the string corresponding to Current Code is not yet in the Dictionary 11, the NO branch is taken from the block 82 to a block 85. At the block 85, exception case processing is performed, as will be described in detail with respect to FIG. 5. The processing performed at the block 85 is predicated on the well known exception case LZW data compression processing of, for example, said U.S. Pat. No. 4,558,302. It is appreciated that exception case processing will be invoked in the embodiment described herein when the received compressed code in the Current Code register 30 is equal to the code in the Code Counter 32.

Processing proceeds from the blocks 83–85 to a block 86 whereat the Current Code in the Current Code register 30 is transferred to the Previous Code register 31. Processing then loops back to the block 80 to fetch the next input compressed code.

Figure 3:
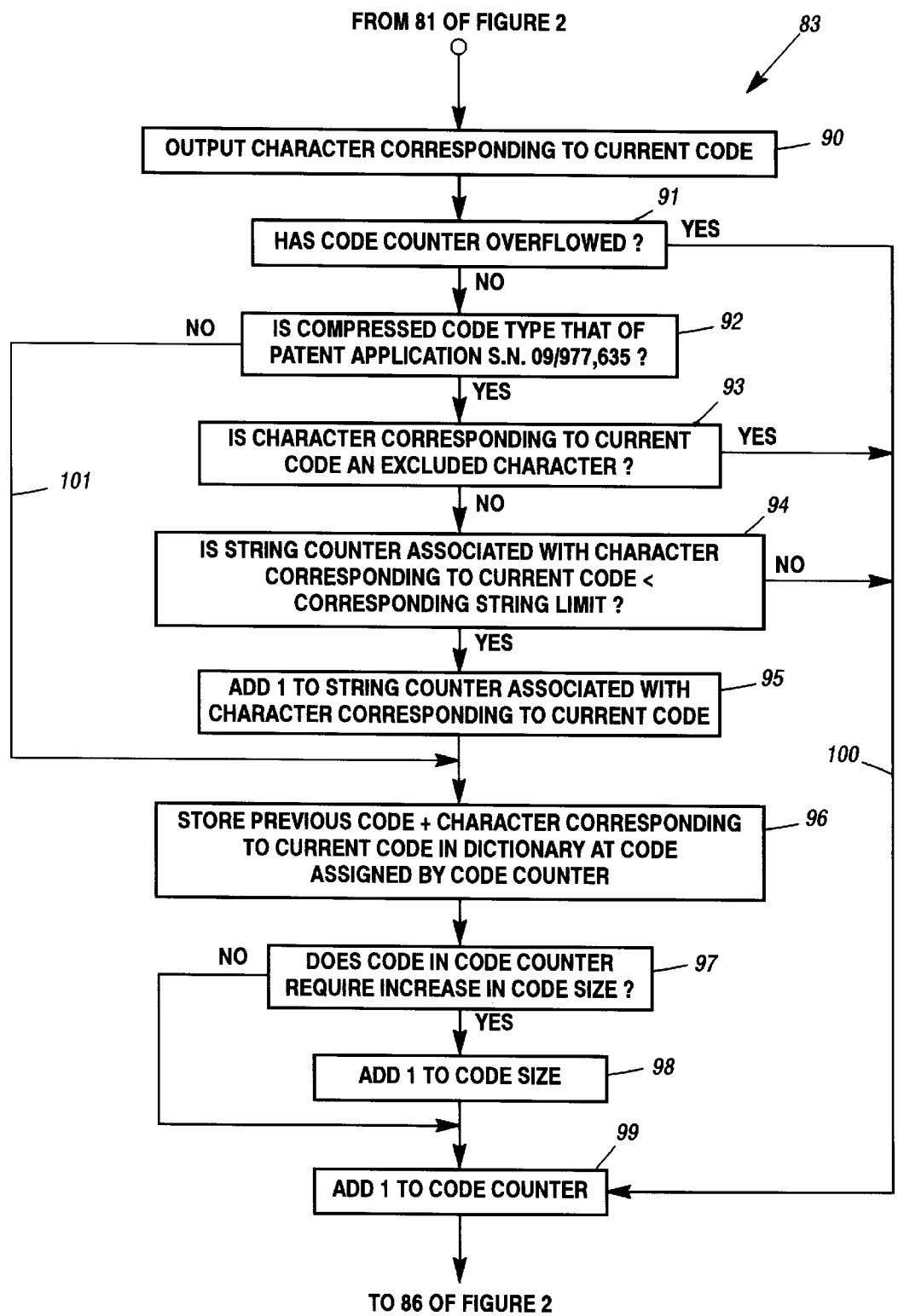
FIGS. 3, 4 and 5 are control flow charts illustrating details of the character processing, string processing and exception case processing of FIG. 2, respectively.

Referring to FIG. 3, with continued reference to FIGS. 1 and 2, details of the character processing of the block 83 of FIG. 2 are illustrated. It is appreciated that the character processing of FIG. 3 is invoked when the decompressor 10 receives an input compressed code that represents a single character string. Accordingly, processing enters a block 90 from the block 81 of FIG. 2 whereat the character corresponding to the code in the Current Code register 30 is provided by the decompressor 10 at the output 14.

At a block 91, a test is performed to determine if the Code Counter 32 has overflowed. When the Code Counter 32 has overflowed, the YES branch from the block 91 bypasses the remaining processing of FIG. 3, via a path 100, to return to the block 86 of FIG. 2. In this manner the decompressor 10 can continue to decompress input code even though the Dictionary 11 is full. Furthermore, when the Code Counter 32 has overflowed, it is effective if the NO branch from the block 81 of FIG. 2 bypasses the block 82 to connect directly to the block 84.

If the Code Counter 32 has not overflowed, the NO branch from the block 91 is taken to a block 92 whereat the Compressed Code Type Indicator 43 is tested to determine if the compressed code stream at the input 13 of the decompressor 10 is from a compressor of the type described in said Ser. No. 09/977,635. If the Indicator 43 indicates a compressor of this type, the YES branch from the block 92 is taken to a block 93. At the block 93, the Excluded Characters Table 42 is consulted to determine if the character corresponding to the code in the Current Code register 30 is included therein. If the character corresponding to Current Code is not an excluded character, the NO branch from the block 93 is taken to a block 94.

At the block 94, the String Counter 40 associated with the character corresponding to Current Code is compared to the string limit in the corresponding String Limit register 41. If the associated String Counter 40 is less than the corresponding string limit, the YES branch from the block 94 is taken to a block 95. At the block 95, the String Counter 40 associated with the character corresponding to Current Code is incremented by 1.

Processing continues with a block 96 whereat the appropriate update extended string is stored in the Dictionary 11 at the string code assigned by the Code Counter 32. Accordingly, the code in the Previous Code register 31 and the single character from the Current Code register 30 are stored in the Prefix Code field 21 and the Data Character field 22, respectively, of the location of the Dictionary 11 addressed by the Code Counter 32.

Control proceeds from the block 96 to a block 97 whereat the code in the Code Counter 32 is tested to determine if an increase in code size is required. If so, processing continues to a block 98 whereat the Code Size register 33 is incremented by 1. If an increase in code size is not required at the block 97, the block 98 is bypassed to continue processing at a block 99. At the block 99, the Code Counter 32 is incremented by 1. Processing returns from the block 99 to the block 86 of FIG. 2.

If, at the block 93, the character corresponding to Current Code is included in the Excluded Characters Table 42 or if, at the block 94, the String Counter 40 associated with the character corresponding to Current Code is not less than the corresponding string limit, control returns directly to the block 86 of FIG. 2, via the path 100, bypassing the processing of the blocks 95–99. Thus, if the YES branch is taken from the block 93 or the NO branch is taken from the block 94, storing of the update extended string (block 96), incrementing the Code Counter 32 (block 99) and incrementing the associated String Counter 40 (block 95) are bypassed via the path 100.

If, at the block 92, the compressed code type is not that of said Ser. No. 09/977,635, the NO branch from the block 92 is taken directly to the block 96 bypassing the blocks 93–95 via a path 101. Thus it is appreciated that the path 101 effectively bypasses the bypass path 100 resulting in the decompressor 10 defaulting to a standard LZW decompression configuration.

Figure 4:
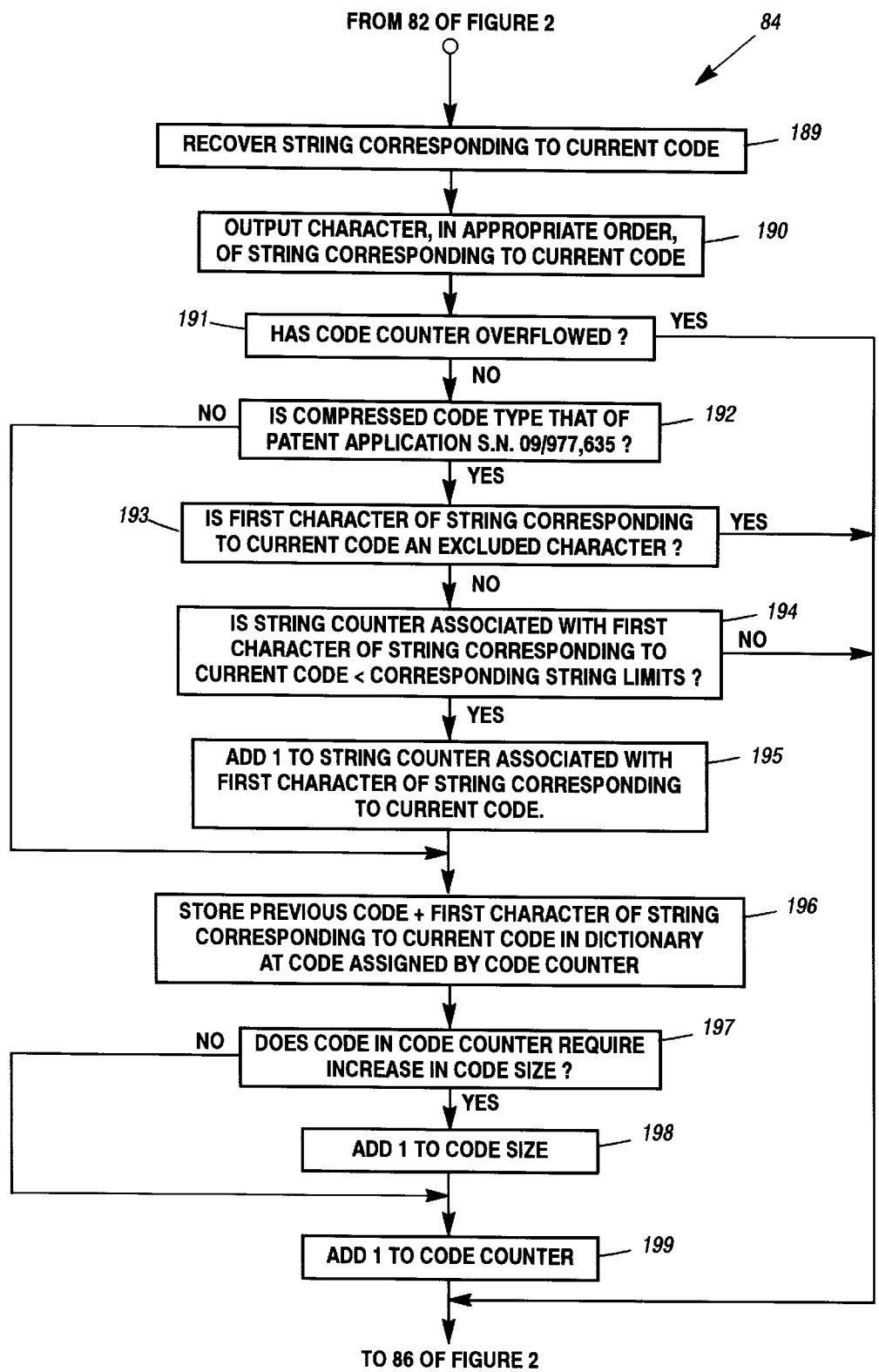

Referring to FIG. 4, with continued reference to FIGS. 1–3, details of the string processing of the block 84 of FIG. 2 are illustrated. The string processing 84 illustrated in FIG. 4 is similar to the character processing 83 of FIG. 3, and for correlation, elements of FIG. 4 are given reference numerals that are 100 greater than the reference numerals of corresponding elements of FIG. 3. For brevity, the differences between the processing of FIG. 4 and that of FIG. 3 will be described.

It is appreciated that the string processing of FIG. 4 is invoked when the decompressor 10 receives an input compressed code that represents a multiple character string that is stored in the Dictionary 11. Accordingly, processing enters a block 189 from the YES branch of the block 82 of FIG. 2. At the block 189, the characters of the string corresponding to the input code in the Current Code register 30 are recovered from the Dictionary 11 and stored in the String Recovery Buffer 35 as described above. At a block 190, the characters of the string corresponding to Current Code are provided by the decompressor 10 at the output 14 in appropriate order.

The blocks 191–199 and the paths 200 and 201 correspond to the respective blocks 91–99 and paths 100 and 101 of FIG. 3 and the descriptions given above with respect to the elements 91–101 substantially apply thereto. The test of the block 193 determines if the first character of the string corresponding to Current Code is included in the Excluded Characters Table 42. The first character of the string corresponding to Current Code resides in the String Recovery Buffer 35 pursuant to the processing of the block 189. The test of the block 194 determines if the String Counter 40 associated with the first character of the string corresponding to Current Code is less than the string limit in the corresponding String Limit register 41. At the block 195, the String Counter 40 associated with the first character of the string corresponding to Current Code is incremented. At the block 196, the update extended string comprises the Previous Code extended by the first character of the string corresponding to Current Code.

Figure 5:
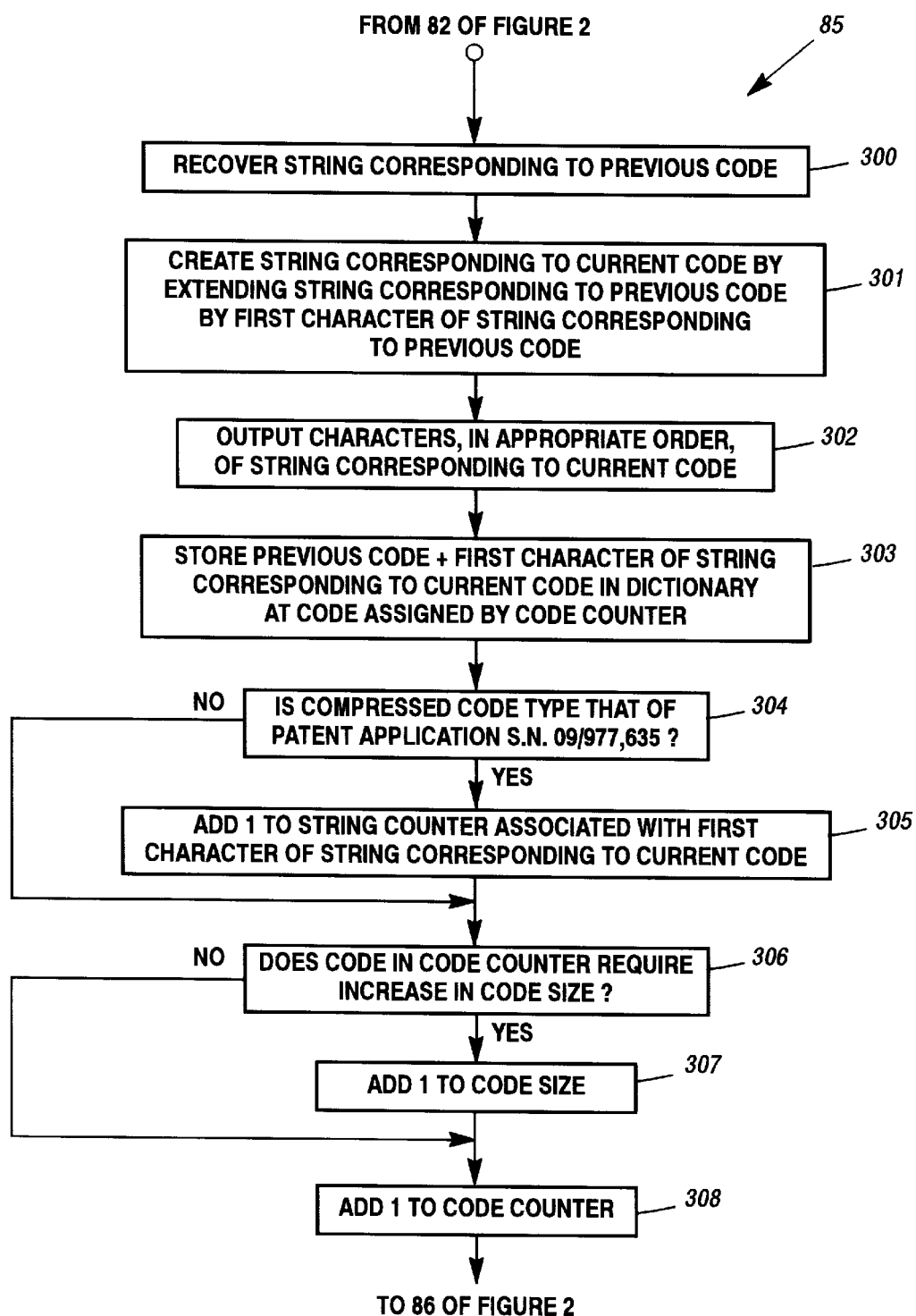

Referring to FIG. 5, with continued reference to FIGS. 1–4, details of the exception case processing of the block 85 of FIG. 2 are illustrated. The exception case processing of FIG. 5 is invoked when the decompressor 10 receives an input compressed code that represents a multiple character string that is not yet stored in the Dictionary 11. Accordingly, processing proceeds from the NO branch of the block 82 of FIG. 2 to a block 300 whereat the string corresponding to Previous Code is recovered. If Previous Code corresponds to a multiple character string, the code in the Previous Code register 31 is utilized to access the Dictionary 11 to recover the characters of the string utilizing the procedures discussed above with respect to string recovery. The characters of the string are transferred to the String Recovery Buffer 35. If Previous Code corresponds to a single character string, the value of the character is in the Previous Code register 31 and is transferred to the String Recovery Buffer 35. The string recovery logic 34 is utilized in performing the described functions of the block 300.

Processing proceeds from the block 300 to a block 301 whereat the string corresponding to Current Code is created by extending the string corresponding to Previous Code by the first character of the string corresponding to Previous Code. This function is readily performed utilizing the string corresponding to Previous Code that is now stored in the String Recovery Buffer 35. If the string corresponding to Previous Code is a single character, the character is simply repeated forming a two character string.

Processing proceeds to a block 302 whereat the characters of the string corresponding to Current Code, created at the block 301, are provided in appropriate order by the decompressor 10 from the String Recovery Buffer 35 to the output 14.

At a block 303, the update extended string is stored in the Dictionary 11 in a manner similar to that described above with respect to the blocks 96 and 196 of FIGS. 3 and 4, respectively. Thus, at the block 303, the string comprising Previous Code extended by the first character of the string corresponding to Current Code (created at the block 301) is stored in the Dictionary 11 at the code assigned by the Code Counter 32. As before, Previous Code is taken from the Previous Code register 31 and the first character of the string corresponding to Current Code is in the String Recovery Buffer 35.

At a block 305, the String Counter 40 associated with the first character of the string corresponding to Current Code is incremented by 1 to account for the string stored at the block 303. However, at a block 304, the compressed code type is tested, as discussed above with respect to blocks 92 and 192 of FIGS. 3 and 4, respectively, to determine if the compressed code type is that of said Ser. No. 09/977,635. If so, the block 305 is executed. If not, the block 305 is bypassed. When the decompressor 10 defaults to a standard LZW decompression configuration, the String Counters 40 are not utilized.

Processing then proceeds to blocks 306–308 whereat the Code Counter 32 is incremented in the manner described above with respect to the blocks 97–99 of FIG. 3. Thereafter processing returns to the block 86 of FIG. 2.

It is appreciated in the processing of FIGS. 2–5 that when the end of data occurs at the input 13 to the decompressor 10, processing terminates at the block 80 of FIG. 2.

Referring to FIG. 6, with continued reference to FIGS. 1–5, an example of the operation of the decompressor 10 in accordance with the flow charts of FIGS. 2–5 is illustrated. At the top of FIG. 6, an input compressed code stream is shown where sequential codes are identified by code sequence numbers. This is done to facilitate following the progress of the codes through the steps of the example. It is appreciated that the sequence numbers are shown for purposes of code identification and do not appear in the actual compressed code stream.

The example is largely self-explanatory, with the actions performed delineated in the left-hand column and the blocks of FIGS. 2–5 that participate in the actions designated in the right-hand column. The input compressed code stream is the compressed code stream provided at the output of the compressor of said Ser. No. 09/977,635 in the example of FIG. 3 thereof. The data character stream in the output of FIG. 6 hereof is the input data character stream of the compressor of said Ser. No. 09/977,635 of the example of FIG. 3 thereof. It is appreciated, therefore, that the decompressor 10 of the present application has recovered the original data character stream of the example of FIG. 3 of said Ser. No. 09/977,635.

A small underlying alphabet size and Code Counter capacity are utilized in the example so that a complete cycle of string code assignment and Code Counter overflow can be illustrated. A 4 character alphabet having a 2 bit character size is utilized with the characters denoted as a, b, x and z. The numerical values of the 2 bit characters are 0, 1, 2 and 3. The Code Counter 32 is 4 bits wide capable of counting up to 15 prior to overflow. When the Code Counter is at a count of 15, the next increment of 1 results in a counter overflow. Since the character values are 0–3, the Code Counter is initialized to a count of 5. The count of 4 is not utilized in the example and may be reserved as a control code. The multiple character string codes, therefore, are the codes 5 through 15 requiring a maximum string code width of 4 bits. For the purposes of the example, the String Limit registers 41 for the characters a, b and x are set to 5, 5 and 1 respectively, with the character z set into the Excluded Characters Table 42.

Thus, in a complete string storage cycle of the decompressor example of FIG. 6, the Code Counter 32 can assign 11 string codes prior to overflow. Although, in the example, the Dictionary 11 only stores eleven multiple character strings, in a practical embodiment, the Dictionary will be significantly larger holding, for example, 4K strings. It is noted that the String Counter status illustrated at an action is the incremented value that occurs at the block 95 or 195 of FIG. 3 or 4, respectively. The String Counter test, therefore, of the block 94 or 194 of FIG. 3 or 4, respectively, is performed with 1 less than the String Counter value illustrated at the action.

In action 1, the Code Counter is set to the first available code of 5 at the block 60 of FIG. 2. In actions 2–6 various strings are recovered and output with the Dictionary 11 updated as illustrated. In particular at action 4, an update string terminating in the character "x" is stored pursuant to the block 96 of FIG. 3 and the associated String Counter 40 is incremented pursuant to the block 95.

In action 7, a string terminating in the character "x" is excluded from storage because, pursuant to the block 94 of FIG. 3, the String Counter 40 associated with the "x" character was not less than the limit of 1 in the associated String Limit register 41. The path 100 of FIG. 3 bypasses the string storage of block 96, the Code Counter incrementing of block 99 and the String Counter incrementing of block 95. At action 8, it is seen that the string code 10 is preserved for the storage of a string terminating in the character "a".

In action 11, a string terminating in the character "z" is excluded from storage because, pursuant to the block 93 of FIG. 3, the character "z" is an excluded character that is in the Excluded Characters Table 42. It is seen that again, the Code Counter 32 is not incremented and the string is not stored because the blocks 96 and 99 are bypassed by the path 100. Thus, at action 12, the string code 13 is preserved for the storage of a string terminating in the character "b".

In action 15, the exception case processing of block 85 is invoked and in action 16, the Code Counter 32 overflows. The overflow is detected at the block 191 of FIG. 4 resulting in a return to the block 86 of FIG. 2 via the bypass path 200. In action 17, the end of data is encountered at the block 80 of FIG. 2.

More detailed descriptions of the actions of FIG. 6 relative to the blocks of FIGS. 2–5 are readily apparent and will not be provided for brevity.

As described above and in said Ser. No. 09/977,635, the compressor of said Ser. No. 09/977,635 utilizes the character table architecture and protocols described therein. The decompressor of the present invention is compatible with the compressor of said Ser. No. 09/977,635 but is predicated on a conventional dictionary decompressor architecture. Protocol modifications are added to provide the compatibility. It is appreciated that the same strings are stored in, and excluded from, the Dictionary 11 herein as are stored in, and excluded from, the character tables of said Ser. No. 09/977, 635.

The decompressor embodiment was explained above in terms of including an optional feature of defaulting to standard LZW when the compressed code stream is not from a compressor of the type described in said Ser. No. 09/977, 635. The invention can also be embodied without this optional feature. In such an embodiment the Compressed Code Type Indicator 43 of FIG. 1 and the blocks 65, 92, 192 and 304 of FIGS. 2–5, respectively, would not be included.

It is appreciated that an alternative embodiment of the decompressor of the present invention could be implemented utilizing the character table architecture of the type described in said Ser. No. 09/977,635. Such a decompressor would include a directory to determine in which character table an input compressed code is stored. In navigating backward through a string, the directory would be consulted to locate the appropriate character tables in which the backward sequence of prefix codes are stored. Alternatively, the character tables could be configured to include the backward character table information. Such a character table implemented decompressor is considered within the scope of the appended claims.

Although the above described embodiment of the invention is LZW based, it is appreciated that the present invention can be utilized with other known dictionary based decompression methodologies. It is further appreciated that the above described embodiment of the invention may be implemented in hardware, firmware, software or a combination thereof. Discrete circuit components may readily be implemented for performing the various described functions. In a software embodiment, appropriate modules programmed with coding readily generated from the above descriptions may be utilized.

While the invention has been described in its preferred embodiment, it is to be understood that the words which have been used are words of description rather than of limitation and that changes may be made within the purview of the appended claims without departing from the true scope and spirit of the invention in its broader aspects.

What is claimed is:

1. A data decompression method for decompressing an input stream of compressed codes to recover an output stream of data characters corresponding thereto, comprising storing, in storage means, strings of data characters, said stored strings having respective codes associated therewith, accessing said storage means with a currently received compressed code so as to recover a string from said storage means corresponding to said currently received compressed code, thereby providing a recovered string, outputting the characters of said recovered string, thereby providing said output stream of data characters, inserting, into said storage means, an extended string comprising the string corresponding to the compressed code received previously to said currently received compressed code extended by the first character of said recovered string, assigning a code to said extended string, maintaining a count of extended strings having a predetermined characteristic that are inserted into said storage means, and controllably bypassing said inserting and assigning steps for extended strings having said predetermined characteristic when said count attains a predetermined limit.

2. The method of claim 1 wherein a string comprises a prefix string of at least one of said characters followed by an extension character, and said predetermined characteristic comprises strings having the same extension character.

3. The method of claim 2 wherein said data characters are from an alphabet of data characters, said method further comprising providing a plurality of string counters corresponding to respective characters of said alphabet, providing a plurality of string limits corresponding to said string counters, respectively, and wherein said maintaining step comprises incrementing the string counter corresponding to a particular character when an extended string having said particular character as the extension character thereof is inserted into said storage means, and said controllably bypassing step comprises controllably bypassing said inserting and assigning steps for an extended string having said particular character as the extension character thereof when the string counter corresponding to said particular character attains the string limit corresponding thereto.

4. The method of claim 2 wherein said data characters are from an alphabet of data characters, at least one of said characters being an excluded character and wherein said controllably bypassing step comprises controllably bypassing said inserting and assigning steps for an extended string having said excluded character as the extension character thereof.

5. The method of claim 1 wherein said input stream includes a compressed code corresponding to a single character and wherein said outputting step includes outputting said single character, and said inserting step comprises inserting, into said storage means, an extended string comprising the string corresponding to the compressed code received previously to said code corresponding to said single character extended by said single character.

6. The method of claim 1 further comprising utilizing a code counter for providing the codes associated with said strings of data characters stored in said storage means, and incrementing said code counter to a next available code when said extended string is inserted into said storage means and bypassing incrementing said code counter when said inserting step is bypassed.

7. The method of claim 6 further including detecting when said code counter has overflowed, and bypassing said inserting and assigning steps when said code counter has overflowed.

8. The method of claim 1 wherein said decompression method operates in decompression cycles and said compressed code received previously to said currently received compressed code comprises a previous code, further including setting said previous code to said currently received compressed code in preparation for performing a next decompression cycle.

9. The method of claim 1 wherein said input stream of compressed codes is generated selectively by first and second data compression types, further including
- receiving an indication of the data compression type,
- performing said maintaining a count and said controllable bypassing steps when said indication is of said first compression type, and
- bypassing said performing step when said indication is of said second compression type.

10. The method of claim 3 further including receiving said plurality of string limits as configuration parameters.

11. The method of claim 4 further including receiving said excluded character as a configuration parameter.

12. The method of claim 9 further including receiving said indication of the data compression type as a configuration parameter.

13. Data decompression apparatus for decompressing an input stream of compressed codes to recover an output stream of data characters corresponding thereto, comprising
- storage means for storing strings of data characters, said stored strings having respective codes associated therewith,
- means for accessing said storage means with a currently received compressed code so as to recover a string from said storage means corresponding to said currently received compressed code, thereby providing a recovered string,
- means for outputting the characters of said recovered string, thereby providing said output stream of data characters,
- means for inserting, into said storage means, an extended string comprising the string corresponding to the compressed code received previously to said currently received compressed code extended by the first character of said recovered string,
- means for assigning a code to said extended string,
- means for maintaining a count of extended strings having a predetermined characteristic that are inserted into said storage means, and
- means for controllably bypassing the inserting of said extended string into said storage means and bypassing assigning a code thereto for extended strings having said predetermined characteristic when said count attains a predetermined limit.

14. The apparatus of claim 13 wherein
- a string comprises a prefix string of at least one of said characters followed by an extension character, and
- said predetermined characteristic comprises strings having the same extension character.

15. The apparatus of claim 14 wherein said data characters are from an alphabet of data characters, said apparatus further comprising
- a plurality of string counters corresponding to respective characters of said alphabet,
- means for providing a plurality of string limits corresponding to said string counters, respectively, and wherein
- said maintaining means comprises means for incrementing the string counter corresponding to a particular character when an extended string having said particular character as the extension character thereof is inserted into said storage means, and
- said controllably bypassing means comprises means for controllably bypassing the inserting of said extended string into said storage means and bypassing assigning a code thereto for an extended string having said particular character as the extension character thereof when the string counter corresponding to said particular character attains the string limit corresponding thereto.

16. The apparatus of claim 14 wherein said data characters are from an alphabet of data characters, at least one of said characters being an excluded character and wherein said controllably bypassing means comprises
- means for controllably bypassing the inserting of said extended string into said storage means and bypassing assigning a code thereto for an extended string having said excluded character as the extension character thereof.

17. The apparatus of claim 13 wherein said input stream includes a compressed code corresponding to a single character and wherein
- said outputting means includes means for outputting said single character, and
- said inserting means comprises means for inserting, into said storage means, an extended string comprising the string corresponding to the compressed code received previously to said code corresponding to said single character extended by said single character.

18. The apparatus of claim 13 further comprising
- a code counter for providing the codes associated with said strings of data characters stored in said storage means, and
- means for incrementing said code counter to a next available code when said extended string is inserted into said storage means and bypassing incrementing said code counter when said inserting of said extended string into said storage means is bypassed.

19. The apparatus of claim 18 further including
- means for detecting when said code counter has overflowed, and wherein said controllably bypassing means comprises
- means for bypassing the inserting of said extended string into said storage means and bypassing assigning a code thereto when said code counter has overflowed.

20. The apparatus of claim 13 wherein said decompression apparatus operates in decompression cycles and said compressed code received previously to said currently received compressed code comprises a previous code, further including
- means for setting said previous code to said currently received compressed code in preparation for performing a next decompression cycle.

21. The apparatus of claim 13 wherein said input stream of compressed codes is generated selectively by first and second data compression types, further including
- means for receiving an indication of the data compression type,
- said decompression apparatus being operative to utilize said means for maintaining a count and said means for controllable bypassing when said indication is of said first compression type and not utilizing said means for maintaining a count and said means for controllable bypassing when said indication is of said second compression type.

22. The apparatus of claim 15 further including means for receiving said plurality of string limits as configuration parameters.

23. The apparatus of claim 16 further including means for receiving said excluded character as a configuration parameter.

24. The apparatus of claim 21 wherein said means for receiving comprises means for receiving said indication of the data compression type as a configuration parameter.

* * * * *